United States Patent
Maekawa et al.

(10) Patent No.: US 10,115,852 B2
(45) Date of Patent: Oct. 30, 2018

(54) SOLAR CELL MODULE

(71) Applicant: Panasonic Intellectual Property Management Co., Ltd., Osaka (JP)

(72) Inventors: Akimichi Maekawa, Osaka (JP); Tasuku Ishiguro, Osaka (JP); Hiroshi Kanno, Osaka (JP); Takahiro Mishima, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/059,281

(22) Filed: Mar. 2, 2016

(65) Prior Publication Data
US 2016/0260858 A1 Sep. 8, 2016

(30) Foreign Application Priority Data
Mar. 3, 2015 (JP) .................. 2015-040853

(51) Int. Cl.
| | | |
|---|---|---|
| *H01L 31/054* | (2014.01) | |
| *H01L 31/0232* | (2014.01) | |
| *H01L 31/05* | (2014.01) | |
| H01L 27/146 | (2006.01) | |

(Continued)

(52) U.S. Cl.
CPC .... *H01L 31/0547* (2014.12); *H01L 31/02327* (2013.01); *H01L 31/054* (2014.12); *H01L 31/0504* (2013.01); H01L 27/14629 (2013.01); H01L 33/405 (2013.01); H01L 33/60 (2013.01);
(Continued)

(58) Field of Classification Search
CPC . H01L 31/0547; H01L 31/048; H01L 31/056; H01L 31/022441; H01L 31/0516; H01L 31/0508; H01L 31/0504; H01L 31/02327; H01L 31/054; H01L 33/405; H01L 2224/0615; H01L 33/60; H01L 27/14629; Y02E 10/52
See application file for complete search history.

(56) References Cited

U.S. PATENT DOCUMENTS

| | | | |
|---|---|---|---|
| 5,994,641 A | 11/1999 | Kardauskas | |
| 6,008,449 A * | 12/1999 | Cole | ............... H01L 31/048 |
| | | | 136/246 |
| 6,323,415 B1 | 11/2001 | Uematsu et al. | |

(Continued)

FOREIGN PATENT DOCUMENTS

WO  99-56317 A1  11/1999

OTHER PUBLICATIONS

The Extended European Search Report dated Jun. 1, 2016 for a corresponding European Patent Application No. 16158369.5.

*Primary Examiner* — Jeffrey T Barton
*Assistant Examiner* — Michael Y Sun
(74) *Attorney, Agent, or Firm* — Metrolexis Law Group, PLLC

(57) ABSTRACT

A solar cell module includes: first and second solar cell strings each including solar cells arranged in an arrangement direction and electrically connected to one another; and a light diffusion sheet disposed between the first and second solar cell strings. The first and second solar cell strings are disposed adjacent to each other and parallel to each other along the arrangement direction. The light diffusion sheet is disposed such that both side edge portions of the light diffusion sheet overlap light-receiving surface sides of side edge portions of the first and second solar cell strings.

21 Claims, 8 Drawing Sheets

(51) Int. Cl.
*H01L 33/40* (2010.01)
*H01L 33/60* (2010.01)

(52) U.S. Cl.
CPC ....... *H01L 2224/0615* (2013.01); *Y02E 10/52* (2013.01)

(56) References Cited

U.S. PATENT DOCUMENTS

| | | | |
|---|---|---|---|
| 2005/0016580 A1* | 1/2005 | Haga | H01L 31/048 136/244 |
| 2012/0118352 A1* | 5/2012 | Asami | H01L 31/048 136/246 |
| 2013/0298965 A1 | 11/2013 | Liu et al. | |
| 2014/0102515 A1 | 4/2014 | Sakuma et al. | |
| 2015/0207003 A1* | 7/2015 | Woo | H01L 31/056 136/246 |

* cited by examiner

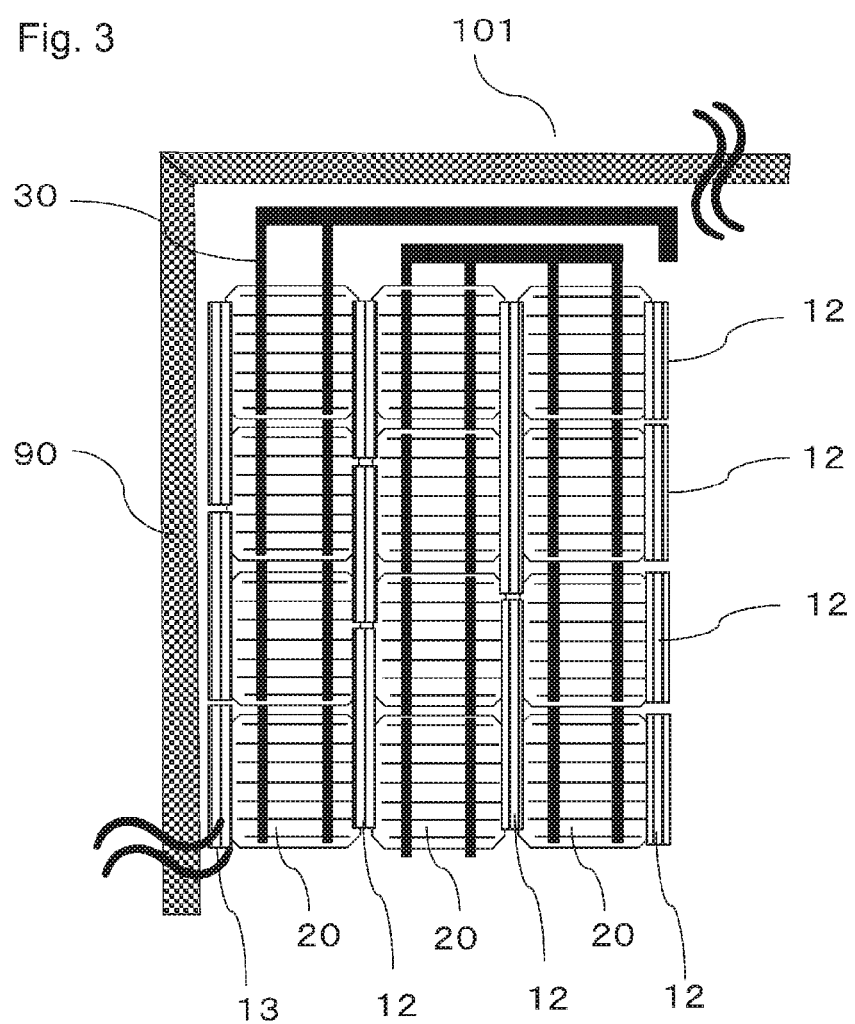

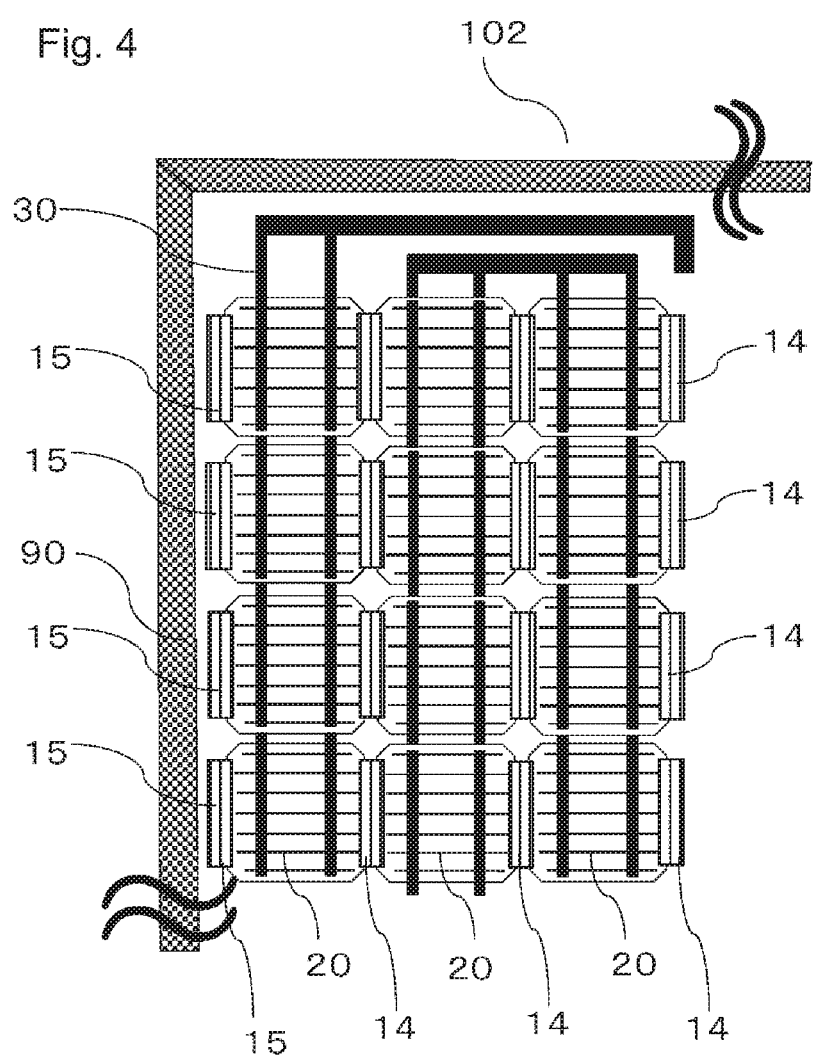

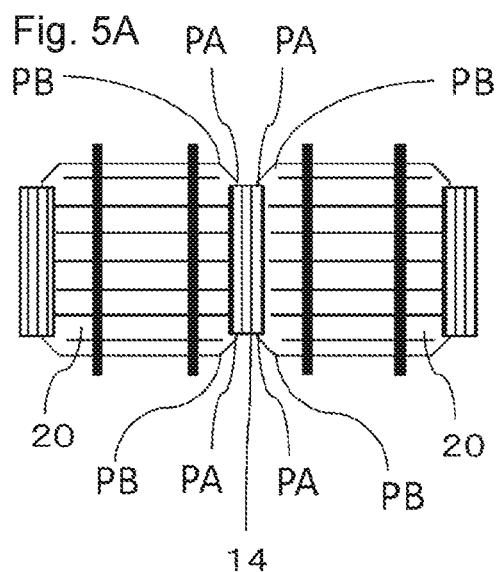
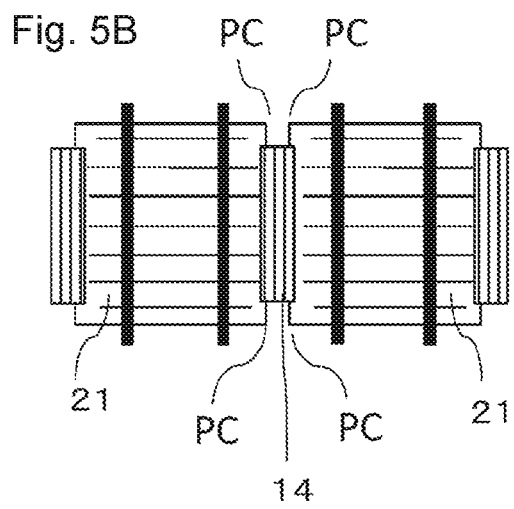

SOLAR CELL MODULE

CROSS REFERENCE TO RELATED APPLICATIONS

This application claims priority from prior Japanese Patent Application No. 2015-040853 filed on Mar. 3, 2015, entitled "SOLAR CELL MODULE", the entire contents of which are incorporated herein by reference.

BACKGROUND OF THE INVENTION

Technical Field

This disclosure relates to a solar cell module.

Related Art

Solar cells are capable of converting clean and inexhaustibly supplied solar energy directly into electric energy, and are therefore expected to be new energy sources.

In general, an output per solar cell is in several watts. For this reason, a solar cell module with its output increased by electrically connecting solar cells to one another is employed when such solar cells are used as a power supply for a house, a building, and the like. A general solar cell module is formed by electrically connecting solar cells in series by use of conductive wiring members while protecting the solar cells against impacts by use of glass, resin fillers, and the like.

In the above-described solar cell module, the adjacent solar cells are disposed at a certain or longer interval so as not to be short-circuited. Moreover, a certain interval is also required between outermost solar cells and a metallic frame that protects surrounding parts of the solar cell module, so as to prevent a short circuit between the outermost solar cells and the frame. In order to efficiently use sunlight incident on such a position and to further increase an output of the solar cell mode, there is disclosed a technique of disposing light reflection members at spaces between and outside the solar cells.

The aforementioned technique has been disclosed in International Patent Application Publication No. WO1999/56317.

SUMMARY OF THE INVENTION

An object of an embodiment of the invention is to provide a solar cell module which can improve an output by further increasing use efficiency of light incident on the solar cell module.

An aspect of the invention is a solar cell module including: first and second solar cell strings each including solar cells arranged and electrically connected to one another; and a light diffusion sheet disposed between the first and second solar cell strings. The first and second solar cell strings are disposed adjacent to each other and parallel to each other along a direction of arrangement of the solar cells, and the light diffusion sheet is disposed such that two side edge portions of the light diffusion sheet overlap light-receiving surface sides of side edge portions of the first and second solar cell strings.

Accordingly, the aspect of the invention can provide a solar cell module with an improved output.

BRIEF DESCRIPTION OF THE DRAWINGS

FIG. 3 is a partial plan view of a solar cell module according to a second embodiment.

FIG. 4 is a partial plan view of a solar cell module according to a third embodiment.

FIG. 5A is a partially enlarged view of solar cells opposed to each other in FIG. 4.

FIG. 5B is a partially enlarged view of solar cells opposed to each other in FIG. 4.

DETAILED DESCRIPTION OF THE EMBODIMENTS

Figure 1:
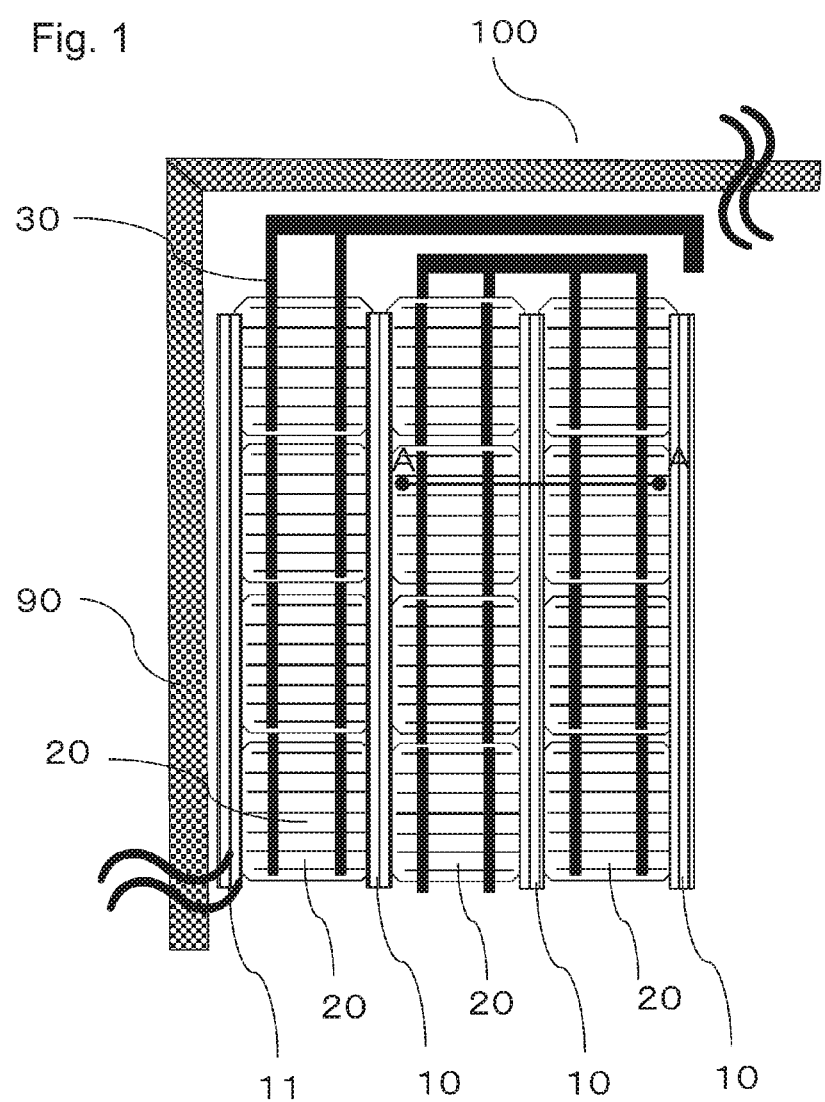
FIG. 1 is a partial plan view of a solar cell module according to a first embodiment.

Embodiments of the invention are described with reference to the drawings. In the following descriptions of the drawings, identical or similar portions are denoted by identical or similar reference numerals. It is to be noted, however, that the drawings are merely schematic and dimensional ratios and other factors therein may be different from actual configurations. Accordingly, specific dimensions and other factors are to be determined in consideration of the following descriptions. Moreover, it is a matter of course that dimensional relations and ratios may vary among the drawings.

First Embodiment (Configuration of Solar Cell Module)

A schematic configuration of solar cell module 100 according to a first embodiment is described with reference to FIG. 1 and FIG. 2. A configuration of solar cell module 100 presented herein is common to modified examples to be described later.

FIG. 1 is a partial plan view of solar cell module 100. FIG. 2 is a cross-sectional view taken along an A-A line indicated in FIG. 1.

As illustrated in FIG. 1, solar cell module 100 includes solar cell strings each formed from solar cells 20, and light diffusion sheets 10 each disposed between the solar cell strings. Solar cell module 100 further includes frame 90 made of metal such as aluminum and disposed in a surrounding manner.

Here, the multiple solar cell strings are disposed adjacent to one another and parallel to one another along a direction of arrangement of solar cells 20. In FIG. 1, three solar cell strings are disposed. In other words, each light diffusion sheet 10 is disposed between two adjacent solar cell strings and in parallel with the solar cell strings.

Figure 2:
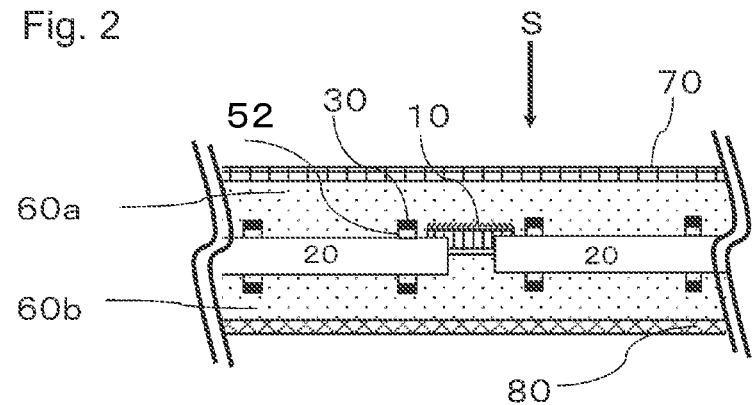
FIG. 2 is a cross-sectional view taken along an A-A line in FIG. 1.

In FIG. 2, two side edge portions of each light diffusion sheet 10 overlap side edge portions of solar cells 20, and are disposed in such a way as to extend over the two solar cell strings. The solar cell strings and light diffusion sheets 10 are protected by sealant members 60a and 60b each formed from a resin sheet and located on a front surface and a back surface, and are further provided with front side protection member 70 and back side protection member 80. Note that arrow S in FIG. 2 indicates a main direction of incidence of sunlight when solar cell module 100 is installed outdoors.

The light diffusion sheet 10 includes a base material 10*a*, a metal film 10*b* deposited on a front side of the base material 10*a*, and an adhesive 10*c* provided on a back side of the base material 10*a*. The base material 10*a* of light diffusion sheet 10 is a resin sheet and may be selected from the group consisting of polyethylene (PE), polyethylene terephthalate (PET), nylon, polycarbonate, polypropylene, polyvinyl chloride, acrylic resins, and the like. Among them, PET is most preferable. Metal or the like forming the metal film 10*b* is vapor-deposited on at least one surface of the light diffusion sheet. Thus, the light diffusion sheet is provided with a light diffusing function.

On the surface provided with the light diffusing function, the light which is incident on and perpendicular to light diffusion sheet 10 is reflected to a direction not perpendicular to the sheet. The light reflected by light diffusion sheet 10 is reflected again at an interface between sealant member 60*a* and front side protection member 70 or an interface between front surface protection member 70 and the atmosphere, and is made incident on solar cells 20 again. A cross-sectional shape of the surface provided with the light diffusing function is not limited as long as the surface has the shape that can make part of the incident light incident again on the solar cells. As illustrated in FIG. 2, it is most preferable to provide projections along a longitudinal direction of light diffusion sheet 10. Although the number and shape of the projections are not limited in particular, the shapes of the projections are preferably continuous rectangles or continuous semicircles, or most preferably continuous triangles. In the most preferable configuration, about 80% of the sunlight that is incident on light diffusion sheet 10 can be made incident again on the solar cells.

Materials of sealant members 60*a* and 60*b* are preferably selected from the group consisting of: thermoplastic resins or thermosetting resins including polyolefins, polyethylenes, polyphenylenes, and copolymers thereof. Sealant members 60*a* and 60*b* are cured by thermocompression bonding. In this case, the materials of sealant members 60*a* and 60*b* may be the same or different from each other, and the combination is not limited in particular. For instance, an ethylene-vinyl acetate (EVA) copolymer may be used to both of sealant members 60*a* and 60*b*.

A hard and highly transparent or transparent material such as a glass plate and an acrylic resin plate is preferably used as front side protection member 70 to further protect cured sealant member 60*a*. A tempered glass plate is used as such a material in this embodiment. A hard and highly weather-resistant material such as glass, a resin sheet having high flexibility, high heat resistance and high water resistance, or a composite resin sheet having highly weather-resistant formed by stacking multiple materials, are preferably used as back side protection member 80 to further protect cured sealant member 60*b*.

This specification describes an example in which a polyolefin resin is used for sealant member 60*a*, an ethylene-vinyl acetate (EVA) copolymer is used for sealant member 60*b*, and a PET sheet is used for the base material 10*a* of light diffusion sheet 10. A thermal shrinkage rate of PET is higher than thermal shrinkage rates of the polyolefin resin and EVA. Accordingly, in the step of curing sealant members 60*a* and 60*b* by thermocompression bonding, light diffusion sheet 10 is inhibited from bending deformation due to compression by sealant member 60*a* or 60*b* provided with fluidity as a consequence of heat application. Thus, light diffusion sheet 10 can retain an appropriate shape for efficiently reflecting the sunlight incident on light diffusion sheet 10. At this time, the thermal shrinkage rates of the respective materials may be measured by using any method as long as such a method is used in general.

(Mode of Disposition of Light Diffusion Sheets)

As illustrated in FIG. 1, solar cell module 100 includes the multiple solar cell strings each of which is formed by electrically connecting solar cells 20 using wiring members 30. In the meantime, light diffusion sheets 10 are disposed between the solar cell strings in such a way as to overlap the side edge portions of solar cells 20. Each light diffusion sheet 10 is designed such that the sunlight incident on light diffusion sheet 10 and thus diffused is reflected at the interface between sealant member 60*a* and front side protection member 70 or the interface between front surface protection member 70 and the air and is made incident on the solar cells again.

Due to restrictions in the manufacturing process, each side edge portion of solar cell 20 includes a non-photovoltaic region where carriers cannot be efficiently generated by photoelectric conversion even when the sunlight is incident thereon. For this reason, it is preferable to dispose light diffusion sheet 10 in the non-photovoltaic region, so as to reflect the sunlight incident on the non-photovoltaic region by using light diffusion sheet 10 and to make the reflected sunlight incident again on a photovoltaic region of solar cell 20. In general, the non-photovoltaic region has a width in a range not exceeding about 3.0 mm when measured from the outer periphery toward the center of solar cell 20.

Light diffusion sheets 10 need to be attached to the solar cell strings in advance before the solar cells are sandwiched between sealant members 60*a* and 60*b*. A method of applying the adhesive 10*c* onto a back side of the base material 10*a* of the light diffusion sheet 10, onto a front side of which the metal or the like is vapor-deposited, and attaching light diffusion sheets 10 to the solar cell strings, is employed as a method of attaching light diffusion sheets 10 to the solar cell strings. In this case, light diffusion sheets 10 may be attached by using the adhesive 10*c* that is cured at a room temperature. Alternatively, light diffusion sheets 10 may be attached by using a resin such as EVA or polyethylene, to be employed as the sealant members for the solar cell module, as the adhesive 10*c* and subjecting the adhesive 10*c* to heating and curing.

The length of each light diffusion sheet 10 is not limited to a particular value. Nonetheless, light diffusion sheet 10 preferably has a sufficient length for fully using the light incident thereon, or most preferably has substantially the same length as the length of the solar cell strings.

Solar cell module 100 includes the multiple solar cell strings. Here, in addition to the light diffusion sheets provided between the adjacent solar cell strings, light diffusion sheet 11 may also be attached to each of the solar cell strings located at outermost ends. Here, only one of two side edge portions of light diffusion sheet 11 may be attached to the solar cell string. In this case, light diffusion sheet 11 would produce an effect which is about a half as much as the effect in the case of disposing the light diffusion sheet to extend over the adjacent solar cell strings.

Second Embodiment

A schematic configuration of solar cell module 101 is substantially the same as that of solar cell module 100 described in the first embodiment. Accordingly, features of solar cell module 101 which are different from those of the first embodiment are mainly described in this embodiment.
(Mode of Disposition of Light Diffusion Sheet)

In this embodiment, as illustrated in FIG. 3, light diffusion sheets 12 that are split into appropriate lengths are disposed between the adjacent solar cell strings while being arranged in the same direction as the arrangement direction of the solar cells. Although a sum of the lengths of light diffusion sheets 12 is not limited to a particular value, the sum preferably has a sufficient length for efficiently using the sunlight incident thereon, or most preferably has substantially the same length as the length of the solar cell strings. The lengths of respective light diffusion sheets 12 may be equal to or not equal to one another, and positions to split light diffusion sheets 12 are not limited either.

Light diffusion sheets 13 that are split into appropriate lengths may also be disposed on the solar cell strings located at the outermost ends of solar cell module 101. Here, as with the first embodiment, only one of two side edge portions of each light diffusion sheet 13 is stacked on and attached to the solar cell string.

In general, the light diffusion sheet is a thin sheet or a foil, which has a shape of an elongated ribbon and is light in weight. For this reason, a high level of technique is required for positioning in the course of attachment when the light diffusion sheet is used to manufacture the solar cell module. Accordingly, by using the split light diffusion sheets, it is possible to improve positioning accuracy when disposing the light diffusion sheets.

Third Embodiment

A schematic configuration of solar cell module 102 is substantially the same as that of solar cell module 100 described in the first embodiment. Accordingly, features of solar cell module 102 which are different from those of the first embodiment are mainly described in this embodiment.
(Mode of Disposition of Light Diffusion Sheets)

FIG. 4 is a plan view of solar cell module 102 of the third embodiment, and FIGS. 5A and 5B are enlarged views for describing in detail the layouts of the light diffusion sheets of the third embodiment.

In this embodiment, as illustrated in FIG. 4, light diffusion sheet 14 is disposed on two solar cells 20 included in different solar cell strings and located adjacent to each other. Specifically, light diffusion sheet 14 is disposed to expose vertices of two solar cells 20 located on mutually opposed sides across light diffusion sheet 14. As illustrated in FIG. 5A, each solar cell 20 of a substantially octagonal shape provided with chamfered corners in a shape of a straight line or an arc includes vertices PA located close to light diffusion sheet 14 and vertices PB located away from light diffusion sheet 14. In this embodiment, each vertex PA may be covered with or exposed from light diffusion sheet 14. Meanwhile, each vertex PB is exposed from light diffusion sheet 14. In the case of using solar cell module 21 of substantially a rectangular shape with extremely small chamfered corners, vertices PC are exposed as illustrated in FIG. 5B.

The vertices of solar cells 20 thus exposed from light diffusion sheet 14 can be used as marks when determining positions to dispose the solar cell strings. As a consequence, it is possible to improve positional accuracy to dispose the solar cell strings, and thus to provide solar cell module 102 having high reliability and good appearance.

Here, light diffusion sheets 15 split into appropriate lengths may also be disposed on solar cell strings located at the outermost ends of solar cell module 102.

Next, descriptions are given of solar cell modules 201, 202, and 203, which represent modified examples that can be embodied in combination with the schematic configurations described so far in the embodiments.

First Modified Example

Solar cell module 201 representing a first modified example is described with reference to FIG. 6.
(Shape of Light Diffusion Sheet)

Figure 6:
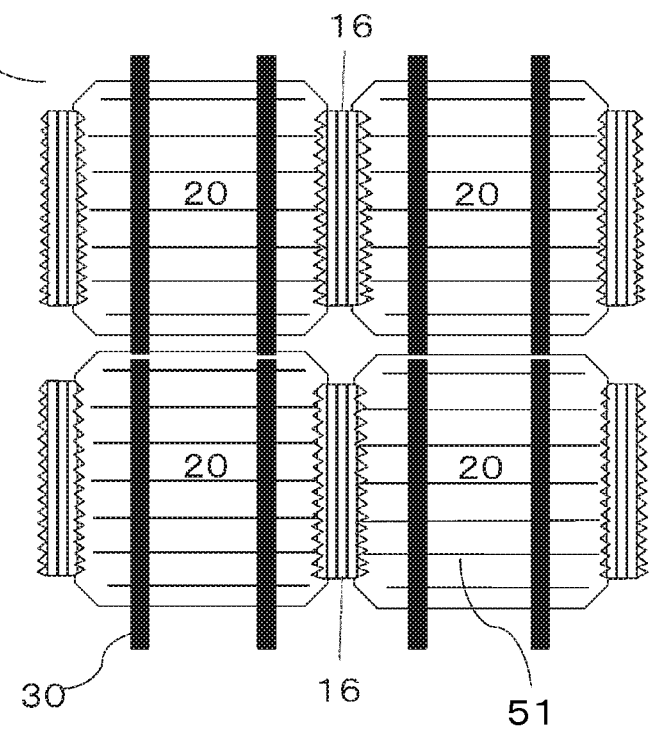
FIG. 6 is a partially enlarged view of a solar cell module of a first modified example.

As evident in FIG. 6, in this modified example, light diffusion sheets 16 each having two side edge portions formed into an uneven shape are used instead of light diffusion sheets 10. When determining positions to dispose the solar cell strings, it is difficult to set the intervals between the adjacent solar cell strings perfectly equal to each other. This is generally attributed to manufacturing variations in the size of solar cells 20 and in the positions to dispose the solar cell strings.

The following effects are therefore produced by forming the two side edge portions of each light diffusion sheet 16 into the uneven shape. Specifically, when light diffusion sheet 16 is used, its width in a lateral direction becomes larger than a width of a rectangular light diffusion sheet even when light diffusion sheet 16 has the area which is equal to that of the rectangular light diffusion sheet. Accordingly, even when the interval between the solar cell strings becomes wider, light diffusion sheet 16 can be attached to the solar cells at tips of protruding portions. Thus, it is possible to reliably attach light diffusion sheet 16 to the two solar cells.

The uneven shape includes a serrated shape, a corrugated shape, a square-wave shape, and the like but is not limited in particular. The width of the uneven shape is not limited in particular, either. However, light diffusion sheet 16 is preferably designed not to expose sealant member 60a or 60b in recessed portions of light diffusion sheet 16. In other words, the portion having the smallest width of light diffusion sheet 16 preferably has a width equal to or greater than the interval between the solar cell strings.

FIG. 6 illustrates an example of disposing light diffusion sheets 16 in a similar way to the third embodiment. However, the layout of light diffusion sheets 16 is not limited to this example. As described previously, each of the light diffusion sheets used in the first and second embodiments may also employ such an uneven shape to the two side edge portions thereof.

Here, light diffusion sheets 17 split into appropriate lengths may also be disposed on solar cell strings located at the outermost ends of solar cell module 201.

Second Modified Example (Length in Lateral Direction of Light Diffusion Sheet)

Next, solar cell module 202 representing a second modified example is described with reference to FIGS. 7 and 8B.

Figure 7:
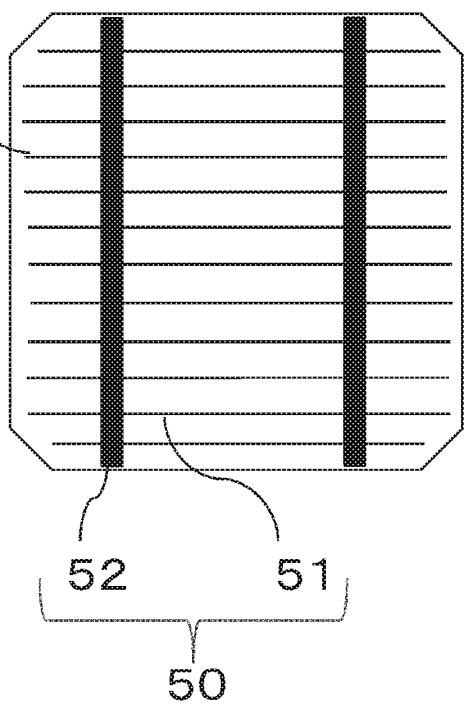
FIG. 7 is a plan view of a solar cell of a second modified example.

FIG. 7 is a plan view of typical solar cell 20. Solar cell 20 includes grid electrodes 50 located on its surface and formed from conductive paste or the like. Here, the conductive paste is prepared by dispersing conductive particles of silver and the like into a binder resin. Grid electrodes 50 include: fingers 51 for collecting the photoelectric conversion carriers generated by solar cell 20; and bus bars 52 for disposing wiring members, which are configured to further aggregate electric power collected through the fingers, and to electrically connect solar cells 20 to one another.

Figure 8A:
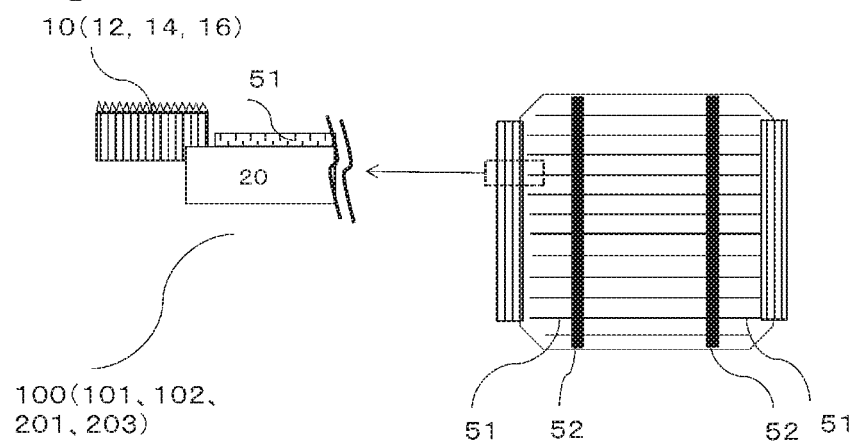
FIG. 8A includes views illustrating a layout of a light diffusion sheet in the solar cell module of the first embodiment.
Figure 8B:
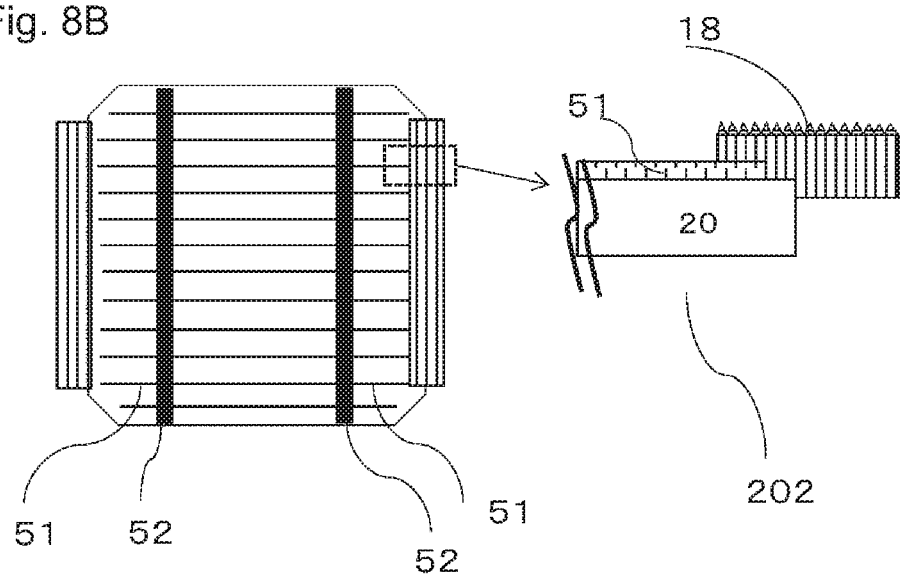
FIG. 8B includes views illustrating a layout of a light diffusion sheet in the solar cell module of the second modified example.

FIG. 8A and FIG. 8B are plan views and partial cross-sectional views illustrating positional relations between fingers 51 and light diffusion sheet 10 in the solar cell modules. In each of solar cell modules 101 and 102 according to the first embodiment, fingers 51 do not overlap light diffusion sheet 10 as illustrated in FIG. 8A. On the other hand, in solar cell module 202 of this second modified example, light diffusion sheet 18 is disposed in such a way as to overlap fingers 51 as illustrated in FIG. 8B. A surface of each grid electrode 50 is not flat but is provided with asperity attributed to conductive particles such as silver. In this way, the asperity provides an anchor effect when light diffusion sheet 18 is attached to solar cell 20, and thus increases adhesion strength. As a consequence, it is possible to suppress detachment of light diffusion sheet 18 during the use of the solar cell module.

Third Modified Example

Figure 9:
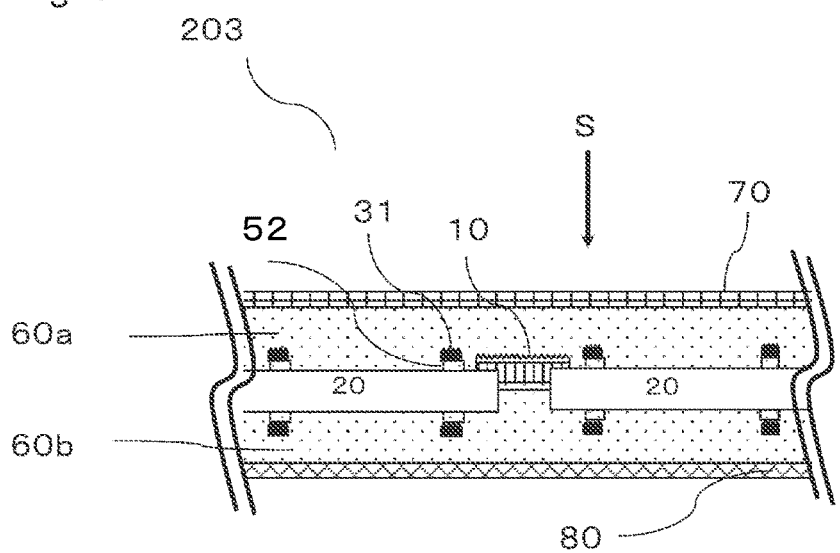
FIG. 9 is a cross-sectional view of a solar cell module of a third modified example.

Next, solar cell module 203 representing a third modified example is described with reference to FIG. 9. FIG. 9 illustrates an example in which wiring members 31 provided with a light diffusing function are used as wiring members for electrically connecting solar cells 20 to one another. Arrow S in FIG. 9 indicates a surface on which the sunlight is mainly made incident when solar cell module 203 is installed outdoors. By using wiring members 31 provided with the light diffusing function, the light once having been made incident on wiring members 31 can be made incident on the solar cells again. Thus, it is possible to further increase an output from solar cell module 203.

Instead of using wiring members 31, solar cells 20 may be first connected to one another by using wiring members 30 not provided with the light diffusing function, and then a cross-sectional structure similar to that of wiring members 31 may be formed by disposing a tape or a sheet, which is provided with the light diffusing function, on wiring members 30.

The first to third embodiments and the first to third modified examples concerning the layout of the light diffusion sheets and other features have been described above. As mentioned previously, any one of the first to third embodiments may be arbitrarily combined with any of the first to third modified examples. Here, the number of examples to be combined is not limited either. Specifically, one of the examples may be combined with one of the embodiments, or two or more examples may be combined with one of the embodiments.

In all of the embodiments and the modified examples of the solar cell module, the method of connecting wiring members (30, 31) to solar cells (20, 21) is not limited in particular. Specifically, the wiring members may be connected to the solar cells by soldering while using copper wiring members each having a structure prepared by providing a copper core with solder coat. Meanwhile, copper wiring members provided with solder coat, copper wiring members not provided with solder coat, or the like may be prepared and such wiring members may be connected to the solar cells by use of a resin adhesive. In the meantime, grid electrodes 50 may be made of metal other than silver. Specifically, grid electrodes 50 containing copper as a main component may be formed while using electrolytic plating and the like.

Furthermore, while this specification describes the example of using solar cells 20 each provided with grid electrodes 50 on a front surface, the type of solar cells are not limited in particular and back contact solar cells may also be used. Even when the back contact solar cells are used, the solar cell module has to be formed by disposing the adjacent solar cells while leaving a space in between, and a non-photovoltaic region still needs to be provided around the solar cells. Disposition of any of light diffusion sheets 10 to 18 as with any of the embodiments are highly effective for achieving efficient use of the sunlight.

What is claimed is:

1. A solar cell module comprising:
   first and second solar cell strings, each of the first and second solar cell strings including solar cells arranged in an arrangement direction and wiring members electrically connecting the solar cells to one another;
   a light diffusion sheet disposed between the first and second solar cell strings; and
   a sealant member sealing the light diffusion sheet and the solar cells of the first and second solar cell strings,
   wherein
   the first and second solar cell strings are disposed adjacent to each other and parallel to each other along the arrangement direction,
   the light diffusion sheet is disposed on a front side as a light-receiving side with respect to the solar cells such that both side edge portions of the light diffusion sheet overlap side edge portions of the first and second solar cell strings and the light diffusion sheet does not overlap the wiring members of the first and second solar cell strings in a planar view of the solar cell module, and
   the light diffusion sheet comprises:
   a base material having a resin sheet; and
   a metal film deposited on a front side of the base material, wherein the light diffusion sheet is in direct contact with a light-receiving surface of the solar cells of each of the first solar cell string and the second solar cell string and a side surface of the solar cells of each of the first solar cell string and the second solar cell string.

2. The solar cell module according to claim 1, wherein the light diffusion sheet is split into pieces in the arrangement direction.

3. The solar cell module according to claim 2, wherein the first solar cell string includes a first solar cell, the second solar cell string includes a second solar cell adjacent to the first solar cell, and the light diffusion sheet is disposed at the front side with respect to the first and second solar cell stings, such that both side edge portions of the light diffusion sheet overlap side edge portions of the first and second solar cells in the planar view of the solar cell module.

4. The solar cell module according to claim 3, wherein vertices located on mutually opposed sides of the first and second solar cells are not covered by the light diffusion sheet.

5. The solar cell module according to claim 1, wherein each of the both side edge portions of the light diffusion sheet is formed into an uneven shape.

6. The solar cell module according to claim 1, wherein each of the solar cells of the first and second solar cell strings includes finger electrodes each of which extends in a first direction on the light-receiving surface thereof, and the light diffusion sheet overlaps the finger electrodes provided on the light-receiving surfaces of the solar cells.

7. The solar cell module according to claim 1, wherein
the first solar cell string is disposed at an outermost end of the solar cell module, and
a light diffusion sheet is disposed at one of both side edge portions of the first solar cell string which is located at a far side of the first solar cell string from the second solar cell string.

8. The solar cell module according to claim 1, wherein
a thermal shrinkage rate of the light diffusion sheet is higher than a thermal shrinkage rate of the sealant member.

9. The solar cell module according to claim 1, wherein the light diffusion sheet further comprises
an adhesive provided on a back side of the base material.

10. The solar cell module according to claim 1, further comprising:
a first solar cell included in the first solar cell string;
a second solar cell included in the second solar cell string, the second solar cell being adjacent to the first solar cell;
a front side protection member located at the light-receiving side with respect to the first and second solar cell strings;
a back side protection member located at a back side with respect to the first and second solar cell strings;
a front side sealant member included in the sealant member, the front side sealant member being positioned between the front side protection member and the first and second solar cells and between the front side protection member and the light diffusion sheet; and
a back side sealant member included in the sealant member, the back side sealant member being positioned between the back side protection member and the first and second solar cells and between the back side protection member and the light diffusion sheet, wherein
the light diffusion sheet is disposed such that light reflected by the light diffusion sheet is reflected again at an interface between the front side sealant member and the front side protection member or an interface between the front side protection member and the atmosphere, and enters at least one of the first and second solar cells.

11. A solar cell module comprising:
first and second solar cell strings, each of the first and second solar cell strings including solar cells arranged in an arrangement direction and wiring members electrically connecting the solar cells to one another; and
a light diffusion sheet disposed between the first and second solar cell strings, the light diffusion sheet extending along the arrangement direction, wherein
the first and second solar cell strings are disposed adjacent to each other and parallel to each other along the arrangement direction,
the light diffusion sheet is disposed on a front side as a light-receiving side with respect to the solar cells such that both side edge portions of the light diffusion sheet overlap side edge portions of the first and second solar cell strings and the light diffusion sheet does not overlap the wiring members of the first and second solar cell strings in a planar view of the solar cell module,
the light diffusion sheet comprises:
a base material having a resin sheet; and
a metal film deposited on a front side of the base material wherein the light diffusion sheet is in direct contact with a light-receiving surface of the solar cells of each of the first solar cell string and the second solar cell string and a side surface of the solar cells of each of the first solar cell string and the second solar cell string, and
the light diffusion sheet includes projections on a main surface thereof, the main surface being located at the light-receiving side, the projections being arranged adjacent to each other from one end to the other end of the main surface of the light diffusion sheet in a width direction of the light diffusion sheet perpendicular to a longitudinal direction of the light diffusion sheet.

12. The solar cell module according to claim 11, wherein the light diffusion sheet is split into pieces in the arrangement direction.

13. The solar cell module according to claim 12, wherein
the first solar cell string includes a first solar cell,
the second solar cell string includes a second solar cell adjacent to the first solar cell, and
the light diffusion sheet is disposed at the front side with respect to the first and second solar cell stings, such that both side edge portions of the light diffusion sheet overlap side edge portions of the first and second solar cells in the planar view of the solar cell module.

14. The solar cell module according to claim 13, wherein
vertices located on mutually opposed sides of the first and second solar cells are not covered by the light diffusion sheet.

15. The solar cell module according to claim 11, wherein the light diffusion sheet further comprises
an adhesive provided on a back side of the base material.

16. A solar cell module comprising:
first and second solar cell strings, each of the first and second solar cell strings including solar cells arranged in an arrangement direction and wiring members electrically connecting the solar cells to one another; and
a light diffusion sheet disposed between the first and second solar cell strings, wherein
the first and second solar cell strings are disposed adjacent to each other and parallel to each other along the arrangement direction,
the light diffusion sheet is disposed on a front side as a light-receiving side with respect to the solar cells such that both side edge portions of the light diffusion sheet are in contact with and overlap side edge portions of the first and second solar cell strings and the light diffusion sheet does not overlap the wiring members of the first and second solar cell strings in a planar view of the solar cell module, and
the light diffusion sheet comprises:
a base material having a resin sheet; and
a metal film deposited on a front side of the base material wherein the light diffusion sheet is in direct contact with a light-receiving surface of the solar cells of each of the first solar cell string and the second solar cell string and a side surface of the solar cells of each of the first solar cell string and the second solar cell string.

17. The solar cell module according to claim 16, wherein the light diffusion sheet is split into pieces in the arrangement direction.

18. The solar cell module according to claim 17, wherein
the first solar cell string includes a first solar cell,
the second solar cell string includes a second solar cell adjacent to the first solar cell, and
the light diffusion sheet is disposed at the front side with respect to the first and second solar cell stings, such that both side edge portions of the light diffusion sheet overlap side edge portions of the first and second solar cells in the planar view of the solar cell module.

19. The solar cell module according to claim 18, wherein vertices located on mutually opposed sides of the first and second solar cells are not covered by the light diffusion sheet.

20. The solar cell module according to claim 1, wherein each of the solar cells of the first and second solar cell strings includes finger electrodes each of which extends in a first direction on the light-receiving surface thereof, and the light diffusion sheet does not overlap the finger electrodes provided on the light-receiving surfaces of the solar cells.

21. The solar cell module according to claim 1, wherein
the light diffusion sheet includes projections on a light-receiving surface thereof, the projections are provided above a gap between the first and second solar cell strings and above the light-receiving surfaces of the solar cells of the first and second solar cell strings.

* * * * *